United States Patent
Hyun

(10) Patent No.: US 7,498,221 B2
(45) Date of Patent: Mar. 3, 2009

(54) METHOD OF FORMING GATE OF SEMICONDUCTOR DEVICE

(75) Inventor: Chan Sun Hyun, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 287 days.

(21) Appl. No.: 11/490,288

(22) Filed: Jul. 20, 2006

(65) Prior Publication Data

US 2007/0141820 A1    Jun. 21, 2007

(30) Foreign Application Priority Data

Dec. 15, 2005    (KR) .................... 10-2005-0123693

(51) Int. Cl.
*H01L 21/336* (2006.01)
(52) U.S. Cl. .................... 438/257; 438/258; 438/197
(58) Field of Classification Search ................ 438/778, 438/645, 761, 789, 790, 258, 197
See application file for complete search history.

(56) References Cited

U.S. PATENT DOCUMENTS 5,981,339 A * 11/1999 Chang et al. ............... 438/257
6,566,196 B1 * 5/2003 Haselden et al. ............ 438/257
6,579,796 B2 * 6/2003 Ying et al. .................. 438/689
2004/0178470 A1 * 9/2004 Hieda ........................ 257/510

FOREIGN PATENT DOCUMENTS

KR    10-2004-0106074 A    12/2004

* cited by examiner

*Primary Examiner*—Thanh V Pham
*Assistant Examiner*—Caleb Henry
(74) *Attorney, Agent, or Firm*—Marshall, Gerstein & Borun LLP

(57) ABSTRACT

A method of forming a gate of a semiconductor device, including the steps of sequentially forming a tunnel oxide film, a nitride film, a dielectric layer, a polysilicon layer, a metal silicide film, and a hard mask film on a semiconductor substrate; sequentially etching the hard mask film, the metal silicide film, the polysilicon layer, and a predetermined region of the dielectric layer, forming a control gate pattern and also exposing the nitride film; performing a thermal oxidization process on both sides of the control gate pattern, forming an oxide film; and stripping the exposed nitride film by a wet etch process, thereby exposing the tunnel oxide film.

7 Claims, 2 Drawing Sheets

METHOD OF FORMING GATE OF SEMICONDUCTOR DEVICE

BACKGROUND

1. Field of the Invention

The invention relates generally to a method of manufacturing semiconductor devices. More particularly, the invention relates to a method of forming a gate of a semiconductor device, wherein a loss of tunnel oxide film is minimized and damage to the semiconductor substrate is prevented.

2. Discussion of Related Art

A method of forming a gate using a high dielectric material as a dielectric layer has been used in a method of manufacturing a NAND flash memory device.

More particularly, a gate formation structure including a semiconductor substrate, a tunnel oxide film, a nitride film, an aluminum oxide ($Al_2O_3$) film, and polysilicon using aluminum oxide ($Al_2O_3$) is the high dielectric material is called a "SANOS structure.

The gate formation process of the SANOS is briefly described below. A tunnel oxide film, a nitride film for a floating gate, an aluminum oxide ($Al_2O_3$) film, a polysilicon layer for a control gate, a tungsten silicide film, and a hard mask film are sequentially formed on a semiconductor substrate.

A photoresist film pattern is formed on the hard mask film. The tungsten silicide film, the polysilicon layer, the aluminum oxide film, and the nitride film are sequentially etched using the photoresist film pattern as a mask, forming a gate.

The gate etch process uses a dry etch process. After the nitride film is stripped, the etch process must be stopped at the tunnel oxide film.

In other words, a recipe in which the nitride film is easily etched and the tunnel oxide film is relatively less easily etched when etching the nitride film (e.g., the selectivity ratio of the nitride film to the tunnel oxide film is set to 10:1) must be used. It is, however, impossible to obtain such high selectivity ratio through prior dry etch techniques. Accordingly, a problem arises because the etch process is difficult to stop at the tunnel oxide film.

Therefore, the tunnel oxide film may be lost. Accordingly, there are problems in that the semiconductor substrate is also attacked and cell characteristics are degraded accordingly.

SUMMARY OF THE INVENTION

In one embodiment, the invention provides a method of forming a gate of a semiconductor device, wherein when etching the gate of the SANOS structure in which the dielectric layer is formed of the high dielectric (K) material, the nitride film is stripped by a wet etch process, whereby the loss of the tunnel oxide film can be minimized, and damage to the semiconductor substrate can be prevented, and cell characteristics can be improved.

According to an aspect, the invention provides a method of forming a gate of a semiconductor device, including the steps of sequentially forming a tunnel oxide film, a nitride film, a dielectric layer, a polysilicon layer, a tungsten or other conductive metal silicide film, and a hard mask film on a semiconductor substrate; sequentially etching the hard mask film, the metal silicide film, the polysilicon layer, and a predetermined region of the dielectric layer, forming a control gate pattern and also exposing the nitride film; performing a thermal oxidization process on both sides of the control gate pattern, forming an oxide film; and stripping the exposed nitride film by a wet etch process, thereby exposing the tunnel oxide film.

The dielectric layer may preferably be formed using $Al_2O_3$.

The etch process of the control gate pattern may preferably be performed using a mixed gas of HBr and $O_2$ or a mixed gas of HBr, $Cl_2$, and $O_2$.

The exposed dielectric layer may preferably be etched using a mixed gas of $BCl_3$, $Cl_2$, and Ar.

The oxide film may preferably be formed to a thickness of 70 Å to 100 Å.

The wet etch process may preferably be performed using phosphoric acid ($H_3PO_4$).

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will now be described in detail in connection with certain exemplary embodiments with reference to the accompanying drawings.

FIGS. 1A to 1D are cross-sectional views illustrating a method of forming a gate of a semiconductor device according to an embodiment of the invention.

Figure 1A:
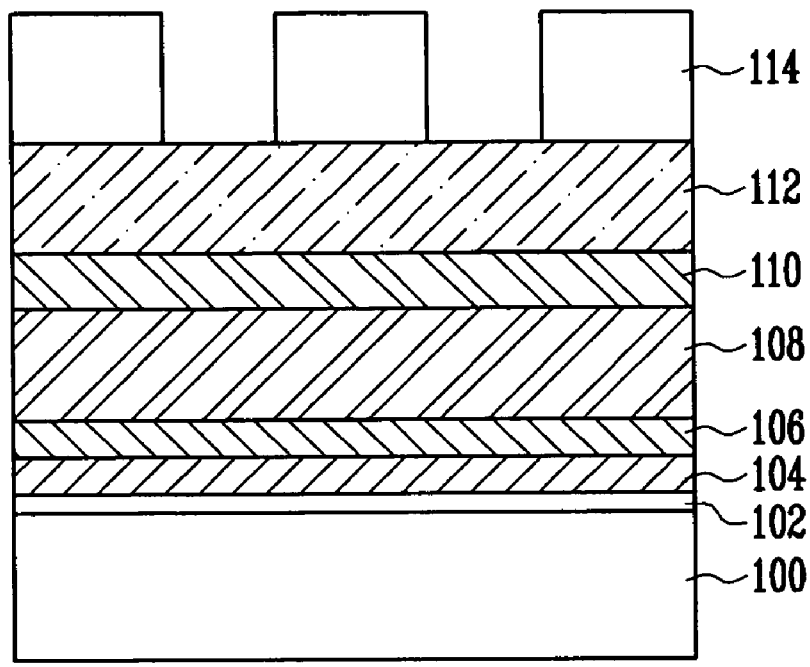
FIGS. 1A to 1D are cross-sectional views illustrating a method of forming a gate of a semiconductor device according to an embodiment of the invention.

Referring to FIG. 1A, a tunnel oxide film 102, a nitride film 104 for a floating gate, a dielectric layer 106, a polysilicon layer 108 for a control gate, a tungsten or other conductive metal silicide film 110, and a hard mask film 112 are sequentially formed on a semiconductor substrate 100.

The dielectric layer 106 may be formed using a high dielectric material including aluminum oxide ($Al_2O_3$). Furthermore, the hard mask film 112 may be formed using oxide.

A photoresist film pattern 114 for performing a gate etch process is formed on the hard mask film 112.

Figure 1B:
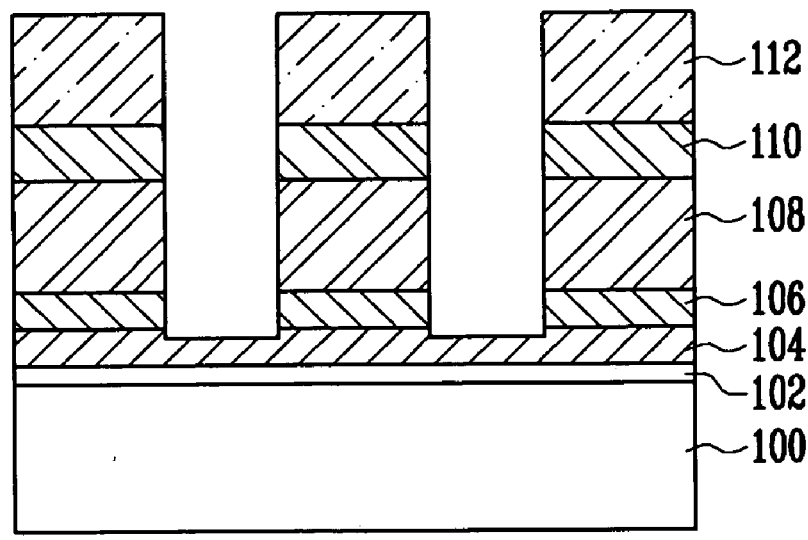

Referring to FIG. 1B, the hard mask film 112, the tungsten silicide film 110, the polysilicon layer 108, and the dielectric layer 106 are sequentially etched using the photoresist film pattern 114 as a mask, thereby exposing the nitride film 104.

In more detail, the hard mask film 112 is etched in the oxide chamber. If the etching of the hard mask film 112 is completed, the photoresist film pattern 114 is stripped and a cleaning process is then performed.

Thereafter, the tungsten silicide film 110 and the polysilicon layer 108 are etched using the etched hard mask film 112 as a mask, thereby exposing the dielectric layer 106. The etch process of the tungsten silicide film 110 and the polysilicon layer 108 may preferably be performed using a mixed gas of HBr and $O_2$, or a mixed gas of HBr, $Cl_2$, and $O_2$.

The exposed dielectric layer 106 is preferably etched using a mixed gas of $BCl_3$, $Cl_2$, and Ar, thereby exposing the nitride film 104.

Figure 1C:
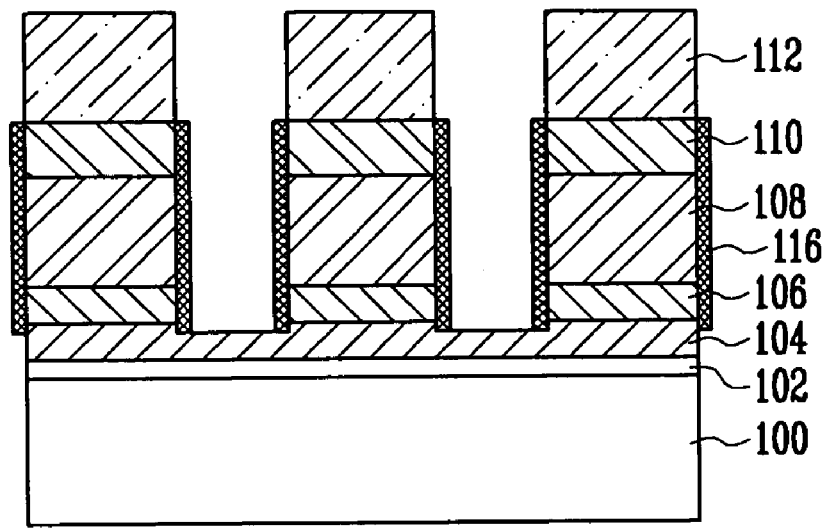

Referring to FIG. 1C, a thermal oxidation process is performed on both sidewalls of the lamination structure of the tungsten silicide film 110, the polysilicon layer 108, and the dielectric layer 106, which are left by the gate etch process, thereby forming an oxide film 116, preferably of 70 Å to 100 Å.

The oxide film 116 is formed so that it can prevent loss that may occur in the lamination structure when stripping the nitride film (i.e., a subsequent process).

Figure 1D:
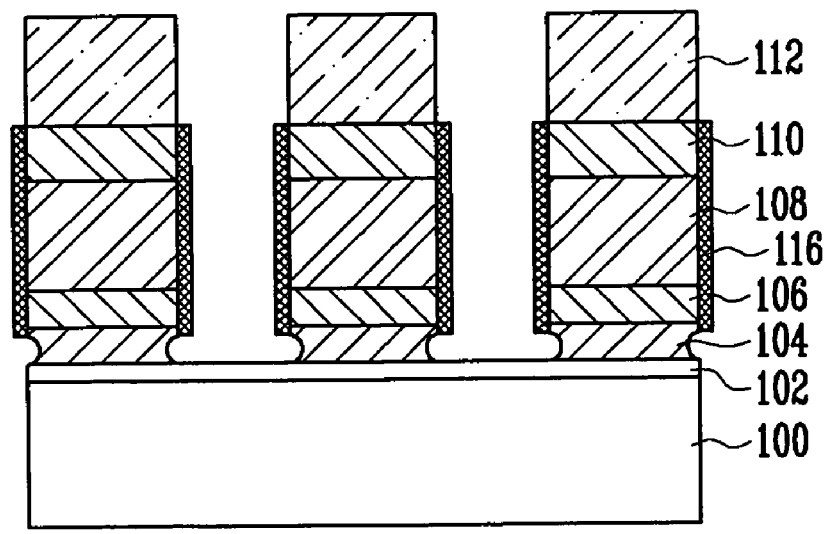

Referring to FIG. 1D, a wet etch process is performed on the nitride film 104 exposed in the process of FIG. 1C, thereby exposing the tunnel oxide film 102. The wet etch process may preferably be performed using phosphoric acid ($H_3PO_4$).

If phosphoric acid is used, the nitride film 104 is stripped while minimizing the loss of the tunnel oxide film 102. Therefore, attack is not generated in the semiconductor substrate 100. Furthermore, if the wet etch process using phosphoric acid is performed, notching may occur at both sides of the nitride film 104 remaining the gate formation portion.

As described above, according to the invention, when etching the gate of the SANOS structure in which the dielectric layer is formed of a high dielectric (K) material, the nitride film is stripped by a wet etch process, whereby the loss of the tunnel oxide film can be minimized, damage to the semiconductor substrate can be prevented, and cell characteristics can be improved.

While the invention has been described in connection with practical exemplary embodiments, the invention is not limited to the disclosed embodiments but, to the contrary, is intended to cover various modifications and equivalent arrangements included within the spirit and scope of the appended claims.

What is claimed is:

1. A method of forming a gate of a semiconductor device, the method comprising:

sequentially forming a tunnel oxide film, a nitride film to be used as a floating gate, a dielectric layer, a polysilicon layer, a metal silicide film, and a hard mask film on a semiconductor substrate;

sequentially etching the hard mask film, the metal silicide film, the polysilicon layer, and a predetermined region of the dielectric layer, to form a control gate pattern and to expose a top surface of the nitride film; and forming an oxide film on both sides of the metal silicide film, the polysilicon layer, and the dielectric layer by performing a thermal oxidization process; and stripping the exposed nitride film by a wet etch process, thereby exposing the tunnel oxide film.

2. The method of claim 1, comprising forming the dielectric layer using $Al_2O_3$.

3. The method of claim 1, comprising sequentially etching the metal silicide film and the polysilicon layer using a mixed gas of HBr and $O_2$ or a mixed gas of HBr, $Cl_2$, and $O_2$.

4. The method of claim 1, comprising sequentially etching the dielectric layer using a mixed gas of $BCl_3$, $Cl_2$, and Ar.

5. The method of claim 1, comprising forming the oxide film to a thickness of 70 Å to 100 Å.

6. The method of claim 1, comprising performing the wet etch process using phosphoric acid ($H_3PO_4$).

7. The method of claim 1, wherein the metal silicide is tungsten silicide.

* * * * *